(12) United States Patent
Milani et al.

(10) Patent No.: US 6,392,188 B1
(45) Date of Patent: May 21, 2002

(54) APPARATUS FOR PRODUCTION OF NANOSIZED PARTICULATE MATTER BY VAPORIZATION OF SOLID MATERIALS

(75) Inventors: Paolo Milani, Pavia; Paolo Giuseppe Carlo Piseri, Milan; Emanuele Barborini, Pizzighettone, all of (IT)

(73) Assignee: Istituto Nazionale per la Fisica Della Materia, Genoa (IT)

( * ) Notice: Subject to any disclaimer, the term of this patent is extended or adjusted under 35 U.S.C. 154(b) by 0 days.

(21) Appl. No.: 09/513,142

(22) Filed: Feb. 25, 2000

(30) Foreign Application Priority Data

Feb. 26, 1999 (IT) .......................................... GE99A0020

(51) Int. Cl.⁷ ............................................. B23K 10/00
(52) U.S. Cl. .................................... 219/121.43; 75/336
(58) Field of Search .................. 219/121.43, 121.48, 219/121.36, 121.47; 118/723 E; 315/111.81, 111.01, 111.71; 313/359.1, 230; 60/203.1; 75/336; 156/345; 373/18, 22, 115

(56) References Cited

U.S. PATENT DOCUMENTS

| | | | |
|---|---|---|---|
| 3,922,214 A | 11/1975 | Van Cakenberghe | |
| 3,962,062 A | * 6/1976 | Ingrey | .................. 204/192.22 |
| 5,110,435 A | 5/1992 | Haberland | |
| 5,425,231 A | * 6/1995 | Burton | ...................... 60/203.1 |
| 5,537,005 A | * 7/1996 | Goebel et al. | .......... 315/111.81 |
| 5,587,093 A | * 12/1996 | Aston | .................... 219/121.48 |
| 5,591,313 A | 1/1997 | Barber, Jr. et al. | |

FOREIGN PATENT DOCUMENTS

EP 0161563 11/1985

OTHER PUBLICATIONS

Hihara, et al., "Formation and Size Control of a Ni Cluster by Plasma Gas Condensation," *Journal of Applied Physics* 84(9):5270–5276 (1998).

* cited by examiner

*Primary Examiner*—Teresa Walberg
*Assistant Examiner*—Quang Van
(74) *Attorney, Agent, or Firm*—Browdy and Neimark

(57) ABSTRACT

There is disclosed an apparatus for production of nanosized particulate matter by vaporization of solid materials, comprising a first chamber (14), a vacuum pump (15) connected to the first chamber (14), a body (2) inserted in the first chamber (14), a cavity (3) formed in the body (2), means (7, 9) for in-feeding a gas flow (8) to the cavity (3), an anode (4) and a cathode (5) partly inserted in the cavity (3), a power supply (6) to apply a voltage between the anode (4) and cathode (5), and a nozzle (11) communicating with the cavity (3) and conveying a beam (12) of particles consisting of vaporized material from the cathode (5), the cathode (5) being disposed facing the gas flow (8) to intercept the latter, and the anode (4) and cathode (5) being positioned so as to allow propagation of an electrical discharge to the gas flow (8) and ionization of the gas itself.

12 Claims, 4 Drawing Sheets

APPARATUS FOR PRODUCTION OF NANOSIZED PARTICULATE MATTER BY VAPORIZATION OF SOLID MATERIALS

FIELD OF THE INVENTION

The invention relates to an apparatus for production of nanosized particulate matter by vaporization of solid materials. Vaporization takes place by material ablation obtained through application of an electric field and consequent generation of an electrical discharge between two electrodes at least one of which is embodied by the material to be vaporized.

DESCRIPTION OF THE PRIOR ART

As known, ablation is removal of surface atoms from a solid following localized transferring of an energy pulse to a region thereof, and it results in local vaporization of such a region.

Usually energy transferring takes places in a sufficiently quick manner so that transformation of the concerned material portion can be considered as occurring under adiabatic conditions, i.e. without the remaining material being affected by heat and in such a manner that the remaining material is maintained at a much lower temperature than its boiling temperature.

In addition, since surface atoms alone are subjected to ablation, material extraction from the solids takes place without running the risk of possible remelting of the material submitted to ablation.

In addition, the adiabatic feature of the process enables highly refractory materials such as graphite, molybdenum, tungsten to be vaporized. This aspect is of particular relevance for gas-phase synthesis of a wide variety of materials: metals, oxides, carbon, carbides and nitrides.

It is also known that for nanoparticles production not only vaporization of solid materials is to be carried out, but also condensation to nanosized particles of the vaporized solid material. This cooling takes place in a thermal bath or cooling element generally consisting of an inert gas.

The energy pulse causing ablation is transmitted to the solid to be vaporized through two mutually alternative modalities: through generation of an electrical discharge or through laser radiation.

In connection with the second modality, it is known that sources or vaporizers for nanoparticle production through laser radiation comprise an excimer laser generating a laser pulse. The pulse is such directed that it strikes on a target to vaporize a small portion of same.

A drawback of these sources or vaporizers is the following: lasers cannot transfer an energy intensity onto a target which may be sufficient for any application, i.e. sufficient for any type of material to be vaporized.

In addition, for control of the laser beam section and the laser beam focusing degree on the target, use of very delicate optical systems to be made from high quality special materials is required.

Furthermore, said lasers for vaporization are by themselves very expensive systems of complicated management and low efficiency.

They are also of difficult adjustment, i.e. they can be hardly adapted to different production or work levels.

In connection with the first modality, i.e. energy transfer by application of an electric field, electric arc vaporization sources are on the contrary used, in which ablation of the solid material takes place following an electrical discharge fired between the electrodes.

Through an appropriate feeding circuit a potential difference is in fact applied to the two electrodes so that a voltaic arc is stricken between them: the electrical discharge causes a small material ablation from either of the electrodes.

The two electrodes are inserted in a block of non-conductive material so that firing of the discharge is always constrained in the gap between the two electrodes. A gas pulse is further constrained to run within the channel delimited by the two electrodes. The high-pressure gas passing during the discharge has the function of removing the ablated material which can thus be used for production of nanoparticles and possibly formation of molecular beams.

Drawbacks in this type of sources are represented by a poor stability of same and the need for frequent servicing because the ablation mechanism causes formation of a deposit on the electrode facing the one from which the material is extracted and/or the walls of the channel in which the electrodes are inserted. This involves a continuous and progressive modification of the gap between the electrodes (and, as a result, instability and short operation life) until a short-circuit occurs.

SUMMARY OF THE INVENTION

The technical task underlying the present invention is therefore to provide an apparatus for production of nanosized particulate matter overcoming the mentioned drawbacks present in known systems.

Within the scope of this technical task it is an important aim of the invention to devise an apparatus provided with features such as stability and intensity which are crucial from the point of view of application.

Another important aim is to devise an apparatus of simple and cheap construction.

The technical task mentioned and the aims specified are achieved by an apparatus for production of nanosized particulate matter by vaporization of solid materials comprising: at least one first chamber, at least one vacuum pump connected with said first chamber, a body inserted in said first chamber, a cavity formed in said body, means for feeding a gas flow to said cavity, at least one anode and at least one cathode at least partly inserted in said cavity, said cathode consisting of material to be vaporized, a power supply to apply a voltage between said anode and cathode and to generate an electrical discharge, and a nozzle communicating with said cavity and adapted to convey a beam of particles consisting of vaporized material from said cathode, in said apparatus said cathode facing said gas flow, so as to intercept the latter, and said anode and cathode being positioned so as to allow a propagation of said electrical discharge to said gas flow and ionization of said gas.

BRIEF DESCRIPTION OF THE DRAWINGS

The features and advantages of the apparatus of the invention are highlighted by the following description of some preferred embodiments of same, illustrated by way of non-limiting examples in the accompanying drawings, in which.

DESCRIPTION OF THE PREFERRED EMBODIMENTS

Figure 1:
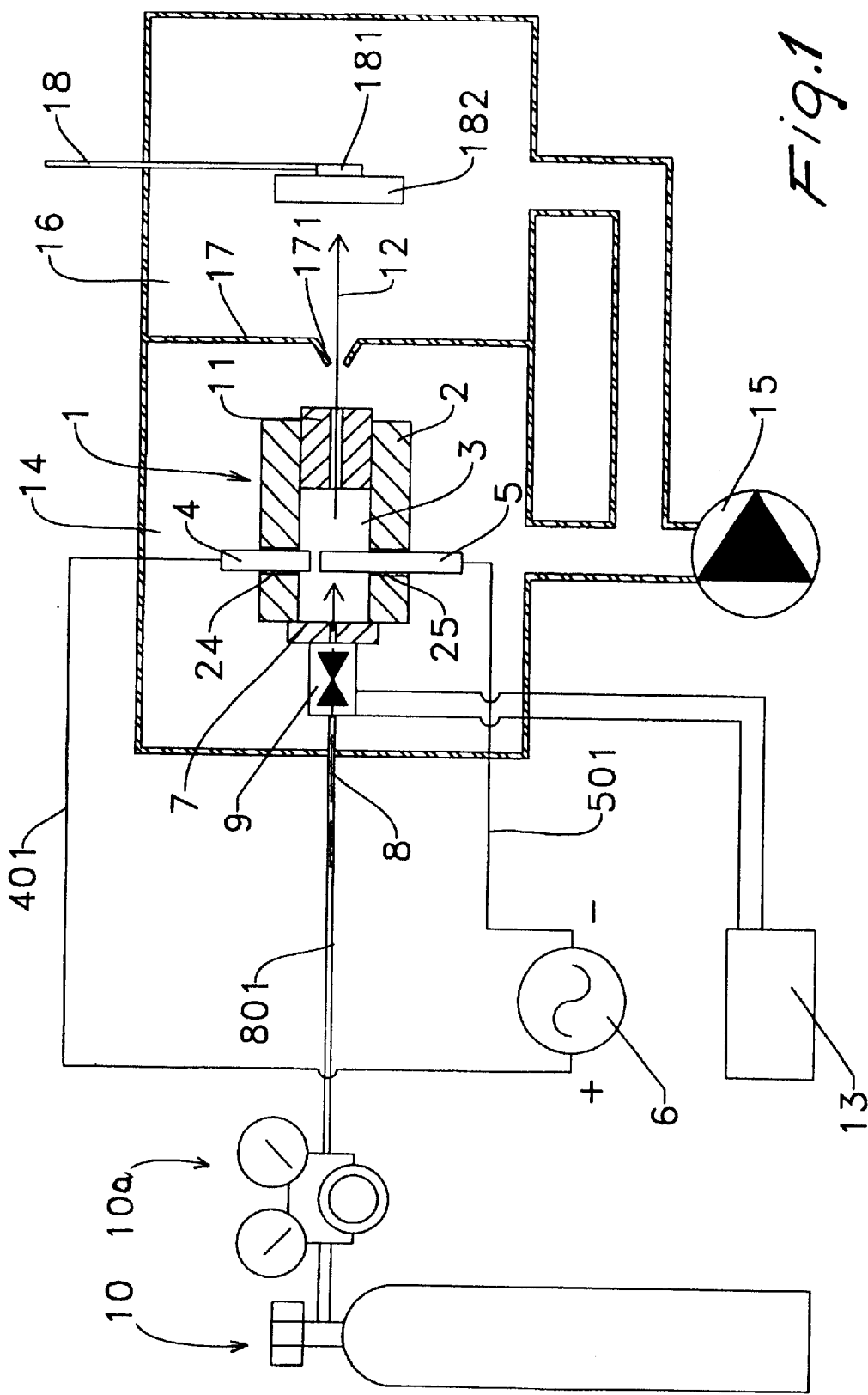
FIG. 1 shows the apparatus of the invention taken as a whole.

With reference in particular to FIG. 1, the apparatus of the invention centrally comprises a vaporizer 1 delimited by a body 2, preferably of ceramic material, within which a cavity 3 of cylindrical shape, with its main axis 3a, is formed. Just as an indication, in the application described by way of example cavity 3 is a cylinder of a volume of about two cubic centimeters or larger.

At least two electrodes consisting of at least one anode 4 and one cathode 6 terminate in the cavity. Preferably cathode 5 has the shape of a cylindrical bar with a diameter of some millimeters and a length of some centimeters for example, and has an extension axis 5a extending lengthwise. Parallelly to the extension axis 5a it is provided with a side surface 5b at which ablation takes place, as specified in the following.

Cathode 5 is made of the material to evaporate by ablation. By way of example, cathode 5 in many cases is made of carbon, a material used for coating electrodes in electrochemical applications, or for coating field-effect electron-emitter cathodes in flat displays for computers, for example. Anode 4 can be variously positioned and its axis 4a can be aligned with or transverse to the extension axis 5a of the cathode. In the instance shown in FIG. 1 axes 4a and 5a are aligned.

Anode 4 and cathode 5 terminate into cavity 3 through respective holes 24 and 25 for example, formed in body 2 and are connected by appropriate electric wires 401 and 501 to a high-voltage and high-current power supply 6.

To generate an electrical discharge, the power supply 6 is adapted to apply a potential difference included between 500 and 2000 V to the electrodes, to generate a current ranging from 500 to 2000 A, over a time of few tens of microseconds.

Looking at FIG. 1, a disc-shaped element 7 is provided on the left side of body 2 and cavity 3, said element having an injection hole 7a for a gas flow 8. The gas flow 8 is dispensed by a valve 9 and drawn by means of a duct 801 from a gas storage bottle 10. A pressure reducing valve 10a is provided immediately downstream of bottle 10.

The injection hole 7a has a diameter preferably smaller than one millimeter. On the right side of cavity 3 there is an outflow nozzle 11 for a beam 12 of nanoparticles produced by vaporization, and of gas. Nozzle 11 is of a diameter of two millimeters and a length of one centimeter, for example.

The injection hole 7a of element 7 and nozzle 11 are preferably disposed along the main axis 3a of cavity 3, on opposite sides of same and the gas flow 8 is at least prevalently coaxial with cavity 3.

Valve 9 drawing the gas upstream under stationary conditions, is connected with a controller 13 for adjustment of the gas flow 8 delivery through pulses of predetermined duration.

The gas delivered from bottle 10 is preferably an inert gas, helium for example. In bottle 10 the gas has a pressure of about two hundred atmospheres and the pressure reducing valve 10a brings the gas pressure to about eight atmospheres within duct 801.

Valve 9 is preferably a solenoid pulsed valve (Series 9 of General Valve Corporation) and the pulse duration is provided to be less than ten thousandths of a second and preferably in the order of five tenths of one thousandth of a second. Controller 13 giving the necessary current pulse to the solenoid of valve 9 for opening of the valve itself, is model Jota One of General Valve Corporation, for example.

Under the above specified conditions, each pulse delivers a helium gas amount that, just as an indication, corresponds to about one micromole or microgram molecule.

Body 2 is enclosed within a first chamber 14 in which the vacuum is created thanks to use of a vacuum pump 15, of the oil-diffusion type for example. Just as an indication, in the first chamber 14, communicating with cavity 3 through nozzle 11, a pressure lower than about ten millibars (corresponding to one thousand Pa) and preferably corresponding to about one hundredth of a millibar is set.

By effect of the gas pulses delivered by valve 9, a pressure is set in cavity 3 which values locally vary in a very marked manner, depending on the considered regions.

In the embodiment shown by way of example, anode 4 and cathode 5 have a mutual distance or gap very reduced in size, of only one-millimeter or less for example, and this gap is displaced with respect to the main axis 3a and the direction of the gas flow 8 coming out of element 7, so that the gap is not impinged on by the gas flow itself.

Above all, cathode 5 including the material to evaporate by ablation, appears transversely and faces the gas flow 8 laterally, so that its side surface 5b is directly impinged on by said gas flow.

Close to the side surface portion 5b of cathode 5 directly impinged on by the gas flow 8, pressure is therefore strongly higher than that present in the other regions of cavity 3.

Adjoining the first chamber 14 there is a second chamber 16, inside which the vacuum is created as well by means of pump 15, said chamber 16 being separated from the first chamber 14 by a wall 17 in which an opening 171 is formed for passage of beam 12 from the first to the second of said chambers. The nanosized particles formed in cavity 3 together with the inert gas introduced therein form a supersonic molecular beam substantially expanding into the vacuum through nozzle 11.

A manipulator 18 can be inserted into chamber 16 and it can be grasped and moved from the outside of chamber 16 and is provided with a support 181 for a substrate 182 on which deposit of the beam 12 of the evaporated material for application is wished to take place, for deposition of nano-structured films for example.

Figure 2:
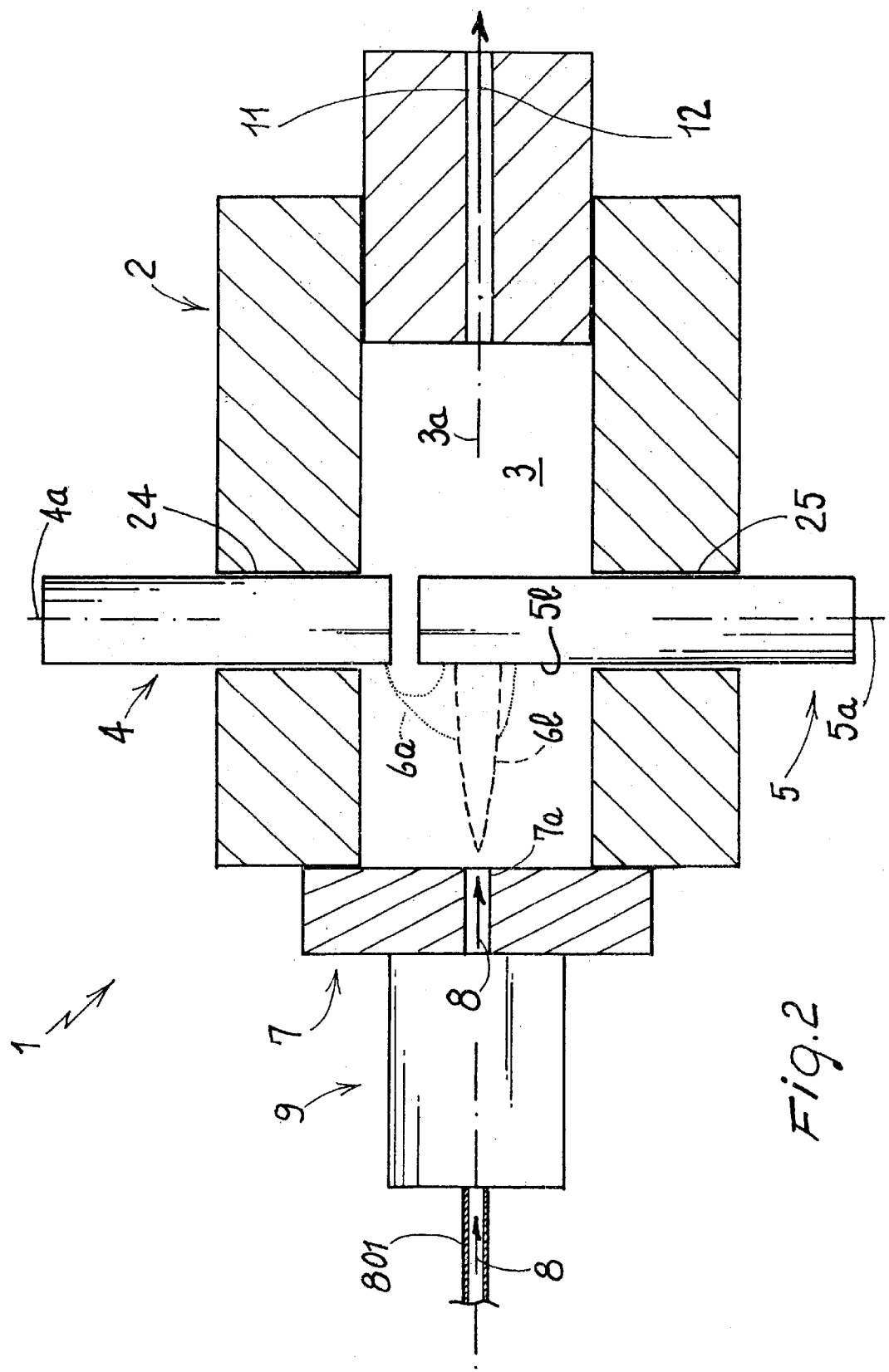
FIG. 2 shows operation of the apparatus in FIG. 1, at its vaporization region.

Position of cathode 5 relative to the gas flow 8 striking on the side surface 5b can be better evaluated in FIG. 2.

The gap between anode 4 and cathode 5 is provided to be of about one millimeter or less, which distance is close to, but lower than the mean free path of ions in the gas injected into cavity 3, at the electrodes.

As known, the mean free path of a gas particle is the average of the straight portions covered between one collision and the subsequent one of said particle with others of the same gas.

This fact (closeness between anode and cathode) enables the electrical discharge to be produced outside said gap and propagate to the region where pressure is higher.

In the surrounding region at the point where the gas flow 8 strikes cathode 5 there is exactly a gas pressure higher than that of the adjoining regions and therefore the electrical discharge, instead of directly closing between the electrodes closes between the anode 4 and the region struck by the gas flow on cathode 5. The gas flow striking cathode 5 is therefore ionized by the electrical discharge and the material is almost exclusively ablated from the region of cathode 5 struck by the ionized gas flow.

In other words, the electrical discharge and the ionized gas flow act together on the same region of cathode 5. Under this situation the greatly ionized gas can exert a strong ionic bombardment onto the cathode. Ionization of the gas flow 8 can take place in an intense manner due to the so-called "avalanche".

Avalanche is a chain reaction known per se, which is produced in the gas admitted to an electric field for example and placed between two electrodes. In the presence of an appropriate electric field, electrons flowing quickly between the electrodes collide with neutral gas particles causing ionization thereof: at each collision a positive ion and two slow electrons are produced.

If the electric field is sufficiently intense, the slow electrons can however acquire enough energy to cause new ionization processes by collision with other neutral gas particles. Therefore in the assembly the so-called avalanche is created. In FIG. 2 the electrical discharge and the ionized gas are diagrammatically identified by 6a at their outermost edge, whereas the inner region of the discharge and plasma is diagrammatically denoted by reference numeral 6b. In fact the ionized jet has a denser inner region 6b and the discharge takes place in proportion to the density of the ionized jet.

As a consequence of the described technical solution, a very strong ablation is obtained, as said, due to the strong ionic bombardment of the ionized gas. In addition the material ablated from cathode 5 is not allowed to deposit onto the anode 4 and cannot cause an undesirable modification of the electrode geometry and obstruction of the gap between the anode 4 and cathode 5 with, as a result, a short circuit between them. The high-pressure region at the point where the gas flow 8 impinges on the cathode 5 also constitutes an excellent thermal bath, which is indispensable to cluster condensing of the ablated material.

In case of operation extended in time, the material ablation potentially involves formation of a crater, due to evaporation of the material, at the point where the gas flow 8 intercepts cathode 5.

In order to avoid this situation, a mechanical system is provided which enables cathode 5 to be rotated about its extension axis 5a.

Figure 3:
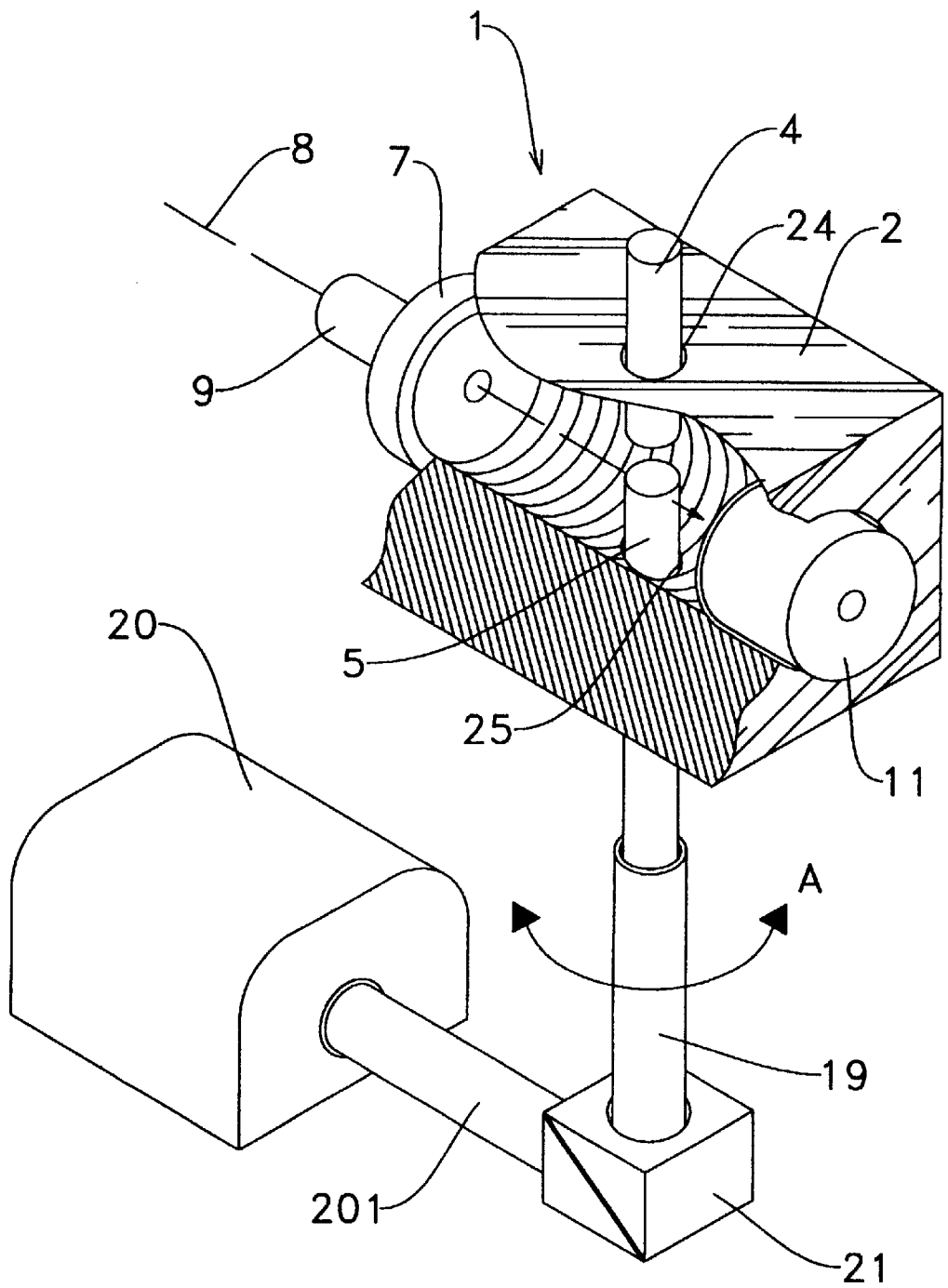
FIG. 3 is a perspective view partly in section of a portion of the apparatus in FIG. 1.

This mechanical system is shown in FIG. 3 and comprises a stem 19 for supporting cathode 5, rotating in the direction of arrow A in a predetermined direction due to operation of an electric motor 20, the shaft 201 of which is coupled, through appropriate couplings 21, to the support stem 19. By virtue of this system therefore, operation of vaporizer 1 can be prolonged and the amount of the eroded material can be increased.

Figure 4:
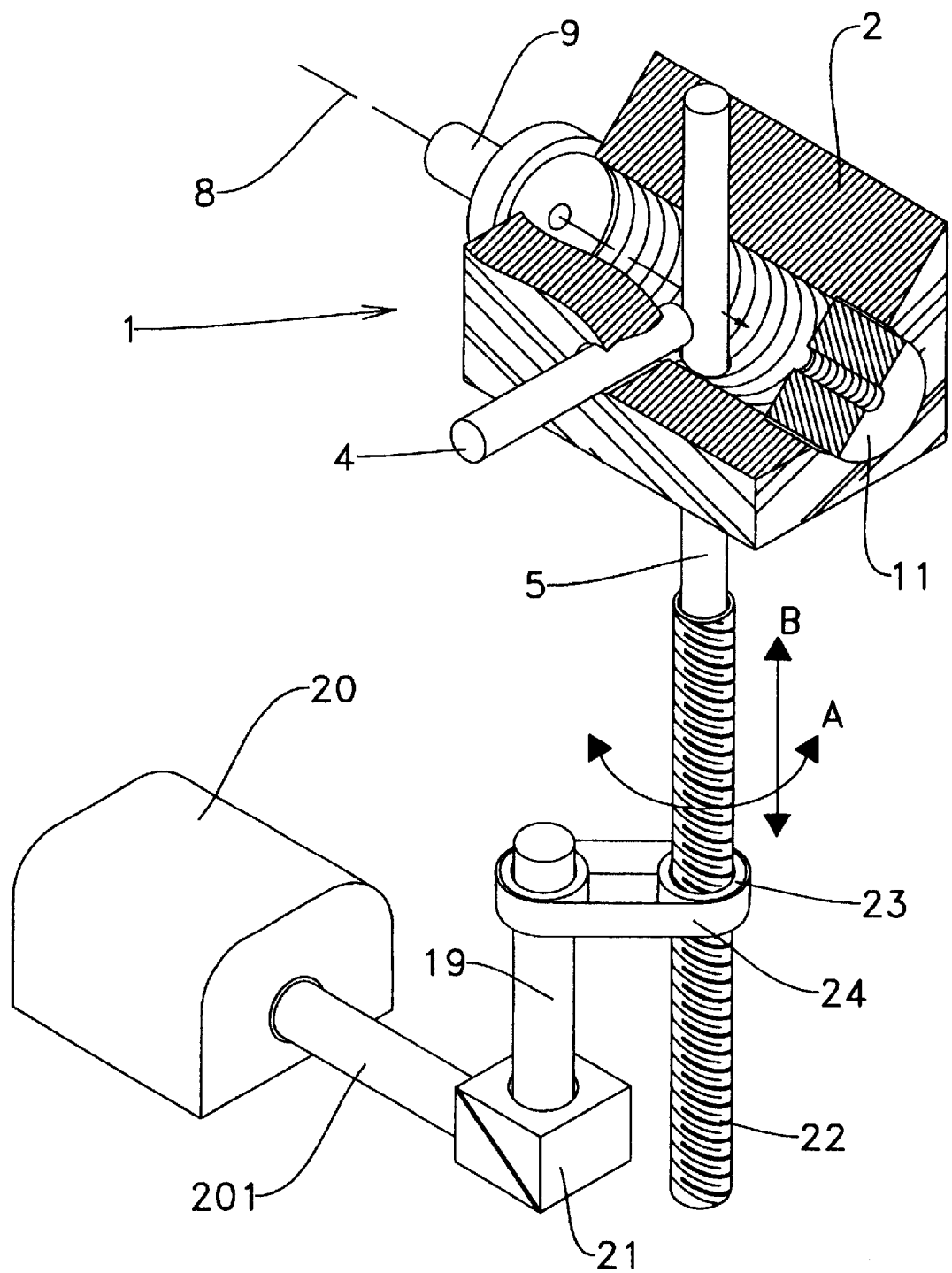
FIG. 4 is a perspective view partly in section of an alternative embodiment of FIG. 3.

Shown in FIG. 4 is an alternative embodiment of FIG. 3 in which anode 4 is not aligned with cathode 5, but disposed laterally of the latter, so that it terminates at a position facing the side surface 5b. In addition, cathode 5 passes through the whole body 2 with possibility of sliding therethrough.

In this embodiment cathode 5 can be continuously fed by a mechanical system enabling rotation thereof in the direction of arrow A and translation in the direction of arrow B in the two preestablished ways.

This system comprises a worm screw 22 supporting cathode 5 and operated by its coupling with a nut screw 23 set in rotation by stem 19 through a driving belt 24. Motion of stem 19 is transmitted through motor 20 and the relevant previously-described transmission means.

Advantageously, with a configuration of this type a very precise adjustment of the distance between the anode and cathode is no longer required. In addition, the material ablation takes place from a portion of cathode 5 which is continuously renewed also in the axial direction: therefore craters or deep furrows are not produced and a greater stability and duration of life in time is ensured to the vaporizer.

Operation of the Apparatus is as Follows.

By valve 9 the gas flow 8 is pulse-injected into cavity 3. Pulse duration is in the order of five tenths of one thousandth of a second for example, as already pointed out.

Before the expanding gas has reached an equilibrium within cavity 3, a voltage is applied to the two electrodes, anode 4 and cathode 5, between which the typical potential difference is, as pointed out, included between 500 and 2000 V and a current included between 500 and 2000 A is generated.

The electrical discharge between anode 4 and cathode 5 spontaneously follows the gas jet, where pressure is higher, ionizing it.

The plasma generated by the electrical discharge vaporizes cathode 5, eroding it at a restricted portion and exactly where the ionized gas flow 8 encounters the side surface 5b of cathode 5.

This vaporization is obtained without the material of which the cathode is made reaching its boiling temperature.

The material of cathode 5 thus vaporized cools in contact with the same gas and condenses into nanosized, particles, giving origin to a beam 12 of aggregates of nanoparticles and gas passing through nozzle 11.

The volume external to vaporizer 1, represented by chamber 14, is maintained under vacuum by pump 15, therefore the beam 12 of nanoparticles coming out of nozzle 11 constitutes a molecular jet and can be used in the gas phase or said nanoparticles can be deposited in layers directly onto the substrate 182 positioned in chamber 16, by passage of beam 12 through opening 171.

In summary, in accordance with the present invention a ionic bombardment is carried out by virtue of which extraction of the material from the solid target takes place following an interaction between a localized dense plasma and the solid surface.

Particularly advantageous technical solutions are first of all the fact that the gas flow 8 impinges on the side surface 5b of cathode 5 and the fact that the gas jet entering cavity 3 produces a gradient of density immediately close to cathode 5. If the electrodes are aligned with each other, the gap between the electrodes is then maintained of a lower width than the mean free path of the ions in the gas under the conditions present between the electrodes. This prevents the discharge from being produced in the gap between the aligned electrodes, which is the shortest travel.

When—under these conditions—a voltage is applied to the electrodes, said gradient of density promotes propagation of the electrical discharge, that will follow the gas jet ionizing it, carrying out a very strong ionization, with an avalanche effect, and a consequent strong ablation.

In an aspect of the present invention the gas flow feeding means comprises a valve adjusted by a controller through which gas flow can be fed into the cavity at predetermined time pulses.

With a pulsed injection a strong gas non-homogeneity is obtained upon the voltage discharge at the electrodes, which discharge further causes confining of the electrical discharge and consequent erosion, to the cathode portion directly exposed to the gas flow.

In other words, the gas non-homogeneity is produced in a particularly efficient manner by the pulsed gas injection and the non-homogeneity itself produces a full confinement of the plasma produced by the electrical discharge to the gas portion which is the closest to element 7.

From the above description it appears that the apparatus of the invention achieves the intended purposes.

Production of nanoparticles as the consequence of pulsed-microplasma ablation is very efficient and ensures flows of an intensity of some orders of magnitude higher than known laser sources.

In fact, it has been noticed that with an apparatus in accordance with the invention, made as previously described, and with a carbon-based cathode it is possible to extract at least 20 million billions ($2\times10^{16}$) of carbon atoms at each pulse of valve 9. This is a value about one hundred times higher than the value achieved by known laser sources.

In addition, the stability in terms of time gap within which the work parameters are ensured is comparable to the most stable laser sources, and is therefore much greater than the stability of known electric-arc sources.

Taken as a whole, the apparatus is characterized by high intensity, good stability from gas pulse to gas pulse, and it lends itself to configurations in which the negative electrode which is vaporized is continuously fed.

The apparatus adapts itself well to all applications in which the region from which the material is ablated is required to be defined with accuracy.

In addition, the apparatus enables a typical drawback of known electric-arc systems to be overcome, i.e. formation of a deposit in the gap separating the two electrodes. This deposit would in fact be dangerous since its size would grow until forming a short-circuit as a result of which the vaporizer would stop operating.

What is claimed is:

1. An apparatus for production of nanosized particulate matter by vaporization of solid materials, comprising at least one first chamber (14), at least one vacuum pump (15) connected with said first chamber (14), a body (2) inserted in said first chamber (14), a cavity (3) formed in said body (2), means (7, 9, 13) for feeding a gas flow (8) to said cavity (3), electrodes comprising at least one anode (4) and at least one cathode (5) at least partly inserted in said cavity (3), said cathode (5) consisting of material to be vaporized, a power supply (6) for applying a voltage between said anode (4) and said cathode (5) and generating an electrical discharge therebetween, a nozzle (11) communicating with said cavity (3) and adapted to convey a beam (12) of particles consisting of vaporized material from said cathode (5), said cathode (5) being arranged in the path of said gas flow (8) so that said gas flow (8) directly impinges on a side surface (5b) of said cathode (5), said anode (4) and said cathode (5) being positioned so as to allow propagation of said electrical discharge to said gas flow (8) and ionization of said gas flow (8), and said electrodes having a mutual distance which is lower than a mean free path of the ions of said gas flow (8) at said electrodes.

2. The apparatus as claimed in claim 1, wherein said means (7, 9, 13) for feeding a gas flow (8) comprises at least one valve (9) and a controller means (13) for controlling said at least one valve (9) to feed pulses of said gas flow (8) to said cavity (3).

3. The apparatus as claimed in claim 2, wherein said pulses have a duration lower than ten milliseconds.

4. The apparatus as claimed in claim 1, wherein said cathode (5) has an extension axis (5a) and wherein provision is made for means (19, 20, 21, 201) for support and rotation of said cathode (5) about said extension axis (5a).

5. The apparatus as claimed in claim 1, wherein said cathode (5) has an extension axis (5a) and a side surface (5b) parallel to said extension axis (5a), and wherein said anode (4) faces said side surface (5b) of said cathode (5).

6. The apparatus as claimed in claim 5, wherein said cathode (5) passes through said cavity (3) of said body (2) and wherein means (20, 22, 23, 24) for support, rotation and translation of said cathode (5) is provided.

7. The apparatus as claimed in claim 1, wherein said first chamber (14) comprises a manipulator (18) downstream of said nozzle (11), said manipulator (18) having a substrate (182) for deposit of a beam (12) of vaporized material coming out of said nozzle (11).

8. The apparatus as claimed in claim 1, wherein a second vacuum chamber (16) is provided which is adjacent to said first chamber (14), and wherein between said first and second chambers (14, 16) a wall (17) is arranged which has an opening (171) for passage of said beam (12) of vaporized material, said second chamber comprising a manipulator (18) having a substrate (182) for deposit of said one beam (12) of vaporized material coming out of said nozzle (11).

9. A process for production of nanosized particulate matter by vaporization of solid materials, comprising: generating a gas flow (8) in a vacuum cavity (3) having electrodes including an anode (4) and a cathode (5) which form a gap therebetween and which are separated by a distance which is less than a mean free path of ions of said gas flow at said electrodes, generating an electrical discharge between said anode (4) and cathode (5), said cathode (5) being made of material to be vaporized, directing said gas flow (8) against a side surface (5b) of said cathode (5), and propagating said electrical discharge to said gas flow (8) to ionize said gas flow (8) at said side surface (5b).

10. The process as claimed in claim 9, wherein said gas flow (8) is obtained by a pulsed injection of gas into said vacuum cavity (3) in the direction of said cathode (5), and wherein between said anode (4) and cathode (5) a voltage is applied at the moment that said pulsed injection forms a non-homogeneity of said gas at said cathode (5), said non-homogeneity causing a confinement of the electrical discharge to a portion of the side surface (5b) of the cathode (5) directly exposed to the gas flow (8).

11. An apparatus for producing nanosized particulate matter by vaporizing solid materials comprising:
   at least one first chamber (14);
   at least one vacuum pump (15) connected with said first chamber (14);
   a body (2) inserted in said first chamber (14);
   a cavity (3) formed in said body (2);
   means (7,9) for feeding a gas flow (8) to said cavity (3);
   electrodes comprising at least one anode (4) and at least one cathode (5), said electrodes being at least partially inserted in said cavity (3);
   said cathode (5) consisting of material to be vaporized;
   a power supply (6) to apply a voltage between said anode (4) and said cathode (5) and to generate an electrical discharge; and
   a nozzle (11) communicating with said cavity (3) and adapted to convey a beam (12) of particles consisting of vaporized material from said cathode (5), said cathode (5) facing said gas flow (8) so as to intercept the gas flow; and
   said anode (4) and said cathode (5) being positioned so as to allow propagation of said electrical discharge to said gas flow (8) and ionization of said gas flow;
   wherein the cathode (5) has an extension axis (5a) and wherein provision is made for means (19, 20, 21, 201)

for support and rotation of the cathode (5) about the extension axis (5*a*).

12. A process for producing nanosized particulate matter by vaporization of solid material comprising:
   a. generating a gas flow in a vacuum cavity at an anode and a cathode which form a gap therebetween, wherein the cathode is made of material to be vaporized;
   b. generating an electrical discharge between said anode and said cathode;
   c. directing the gas flow against a side surface of the cathode;
   d. propagating the electrical discharge to the gas flow to ionize the gas flow at the side surface; and
   e. rotating the cathode about an extension axis thereof for causing different portions of the side surface to be exposed to the gas flow.

* * * * *